US011295927B1

(12) United States Patent
Chen et al.

(10) Patent No.: US 11,295,927 B1
(45) Date of Patent: Apr. 5, 2022

(54) APPARATUS OF CHARGED-PARTICLE BEAM SUCH AS ELECTRON MICROSCOPE COMPRISING CO-CONDENSERS FOR CONTINUOUS IMAGE RESOLUTION TUNING

(71) Applicants: Zhongwei Chen, Los Altos Hills, CA (US); Xiaoming Chen, Sunnyvale, CA (US); Daniel Tang, Fremont, CA (US); Liang-Fu Fan, Fremont, CA (US)

(72) Inventors: Zhongwei Chen, Los Altos Hills, CA (US); Xiaoming Chen, Sunnyvale, CA (US); Daniel Tang, Fremont, CA (US); Liang-Fu Fan, Fremont, CA (US)

(73) Assignee: BORRIES PTE. LTD., Singapore (SG)

( * ) Notice: Subject to any disclaimer, the term of this patent is extended or adjusted under 35 U.S.C. 154(b) by 0 days.

(21) Appl. No.: 17/302,031

(22) Filed: Apr. 21, 2021

Related U.S. Application Data

(60) Provisional application No. 63/087,238, filed on Oct. 4, 2020.

(51) Int. Cl.
| | |
|---|---|
| *H01J 37/141* | (2006.01) |
| *H01J 37/147* | (2006.01) |
| *H01J 37/28* | (2006.01) |
| *H01J 37/20* | (2006.01) |

(52) U.S. Cl.
CPC ........ *H01J 37/141* (2013.01); *H01J 37/1475* (2013.01); *H01J 37/20* (2013.01); *H01J 37/28* (2013.01); *H01J 2237/04922* (2013.01); *H01J 2237/152* (2013.01)

(58) Field of Classification Search
CPC .......... H01J 37/00; H01J 37/02; H01J 37/141; H01J 37/14; H01J 37/10; H01J 37/063; H01J 37/26; H01J 37/28; H01J 37/1475; H01J 37/20; H01J 2237/04922; H01J 2237/152
USPC ............................ 250/306, 307, 311.396 ML
See application file for complete search history.

(56) References Cited

U.S. PATENT DOCUMENTS

| | | | | |
|---|---|---|---|---|
| 5,483,073 | A * | 1/1996 | Benner | H01J 37/04 250/307 |
| 2003/0230727 | A1* | 12/2003 | Tingay | H01J 37/147 250/396 ML |
| 2010/0320942 | A1* | 12/2010 | Hayn | H01J 37/063 315/379 |
| 2012/0211654 | A1* | 8/2012 | Iwaya | H01J 37/04 250/310 |
| 2012/0211694 | A1* | 8/2012 | Evans | C09K 5/20 252/70 |
| 2018/0269030 | A1* | 9/2018 | Stanislav | H01J 37/1413 |

* cited by examiner

*Primary Examiner* — Jason L McCormack
(74) *Attorney, Agent, or Firm* — George Guosheng Wang; United States Research and Patent Firm (57) ABSTRACT

The present invention provides an apparatus of charged-particle beam such as an electron microscope with co-condensers. A source of charged particles is configured to emit a beam of charged particles, and the co-condensers including two or more magnetic condensers are configured to coherently focus the beam to a single crossover spot. The invention exhibits numerous technical merits such as continuous image resolution tuning, and automatic switching between multiple resolutions, among others.

14 Claims, 11 Drawing Sheets

APPARATUS OF CHARGED-PARTICLE BEAM SUCH AS ELECTRON MICROSCOPE COMPRISING CO-CONDENSERS FOR CONTINUOUS IMAGE RESOLUTION TUNING

CROSS-REFERENCE TO RELATED APPLICATIONS

This application expressly claims the benefit under 35 U.S.C. Section 119(e) and Article 4 of the Stockholm Act of the Paris Convention for the Protection of Industrial Property of U.S. Provisional Patent Application No. 63/087,238, filed Oct. 4, 2020, entitled "Several Designs for Apparatus of Charged-Particle Beam and Methods Thereof," the entire disclosure of which is hereby incorporated by reference.

FIELD OF THE INVENTION

The present invention generally relates to an apparatus of charged-particle beam (e.g. electron beam) comprising two or more co-condensers for continuous image resolution tuning. Although the invention will be illustrated, explained, and exemplified by electron microscopes with auto multiple resolution switch, it should be appreciated that the present invention can also be applied to other fields, for example, electron beam recorder, electron beam lithography system, and the like.

BACKGROUND OF THE INVENTION

Apparatuses of charged-particle beam such as transmission electron microscope (TEM) or scanning transmission electron microscope (STEM) are widely used in fields of medical diagnosis, biological research, material analysis, and semiconductor inspection etc. With their high-resolution image technique, TEM and STEM are used as a particularly important diagnostic tool to screen virus, human tissues at high magnification (the ultrastructural level) or material analysis, often in conjunction with other methods, particularly light microscopy, immunofluorescence techniques and PCR etc.

For example, TEM/STEM has great potential for diagnostic purposes when it (1) provides useful (complementary) information in the context of a carefully considered differential diagnosis; (2) provides an 'improved' diagnosis that results in better treatment strategies and; (3) is time & cost effective in respect to alternative techniques. For diagnostic purposes, solid tissues or virus sample can be prepared for TEM/STEM in the same way as other biological tissues. The samples are fixed in glutaraldehyde and osmium tetroxide then dehydrated and embedded in epoxy resin. The ultrathin sections may be collected on 3 mm copper (mesh) grids and stained with uranyl acetate and lead citrate to make the contents of the tissue or virus electron dense (and thus visible in the electron microscope).

Current TEM/STEM samples are collected on 3 mm copper (mesh) grids and are loaded into TEM/STEM system manually. Then operator needs to manually operate TEM/STEM machine to adjust TEM/STEM machine to get focused image and manually select interesting location to take image. After taking the image, the operator must manually analyze the image content to acquire the result. So TEM/STEM operation need well trained expert to operate it and it is also very time-consuming.

For example, current EMs can acquire a scanning image with an extremely high resolution (e.g. 1 nm). However, the EMs have different field of view (FOV) sizes under different resolutions. For example, a typical big FOV size is about 100 um×100 um under 10 nm resolution, but the FOV size will be reduced to 10 um×10 um under 1 nm resolution. Therefore, when a user finds a pattern of interesting (POI) under 10 nm resolution with the EM, and he/she wants to zoom into the POI for further examination with 1 nm resolution, the user would have to mechanically move the sample stage so the sample could be repositioned to the center of a smaller FOV. However, mechanical repositioning of the sample to different POIs locations has a drawback of low efficiency, because it slows down the entire procedure of microscopic examining of the sample Advantageously, the present invention provides a solution to overcome the drawback in the current electron microscopes.

SUMMARY OF THE INVENTION

One aspect of the present invention provides an apparatus of charged-particle beam comprising (1) a source of charged particles configured to emit a beam of charged particles, and (2) co-condensers. The term "co-condensers" is defined as two or more magnetic condensers configured to coherently focus the beam to a single crossover spot F.

The above features and advantages and other features and advantages of the present invention are readily apparent from the following detailed description of the best modes for carrying out the invention when taken in connection with the accompanying drawings.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements. All the figures are schematic and generally only show parts which are necessary in order to elucidate the invention. For simplicity and clarity of illustration, elements shown in the figures and discussed below have not necessarily been drawn to scale. Well-known structures and devices are shown in simplified form, omitted, or merely suggested, in order to avoid unnecessarily obscuring the present invention.

DETAILED DESCRIPTION OF THE PREFERRED EMBODIMENT

In the following description, for the purposes of explanation, numerous specific details are set forth in order to provide a thorough understanding of the present invention. It is apparent, however, to one skilled in the art that the present invention may be practiced without these specific details or with an equivalent arrangement.

Where a numerical range is disclosed herein, unless otherwise specified, such range is continuous, inclusive of both the minimum and maximum values of the range as well as every value between such minimum and maximum values. Still further, where a range refers to integers, only the integers from the minimum value to and including the maximum value of such range are included. In addition, where multiple ranges are provided to describe a feature or characteristic, such ranges can be combined.

It is also to be understood that the terminology used herein is for the purpose of describing particular embodiments only, and it is not intended to limit the scope of the invention. For example, when an element is referred to as being "on", "connected to", or "coupled to" another element, it can be directly on, connected or coupled to the other element or intervening elements may be present. In contrast, when an element is referred to as being "directly on", "directly connected to", or "directly coupled to" another element, there are no intervening elements present.

In an apparatus of charged-particle beam such as an electron microscope, the manipulation of an electron beam is performed using two physical effects. The interaction of electrons with a magnetic field will cause electrons to move according to the left-hand rule, thus allowing for electromagnets to manipulate the electron beam. The use of magnetic fields allows for the formation of a magnetic lens of variable focusing power, and the lens shape is determined by the distribution of magnetic flux. Electrostatic fields can cause the electrons to be deflected through a constant angle. Coupling of two deflections in opposing directions with a small intermediate gap allows for the formation of a shift in the beam path. From these two effects, as well as the use of an electron imaging system, sufficient control over the beam path is made possible. The lenses in the beam path can be enabled, tuned, and disabled entirely and simply via rapid electrical switching, the speed of which is only limited by effects such as the magnetic hysteresis.

Figure 1:
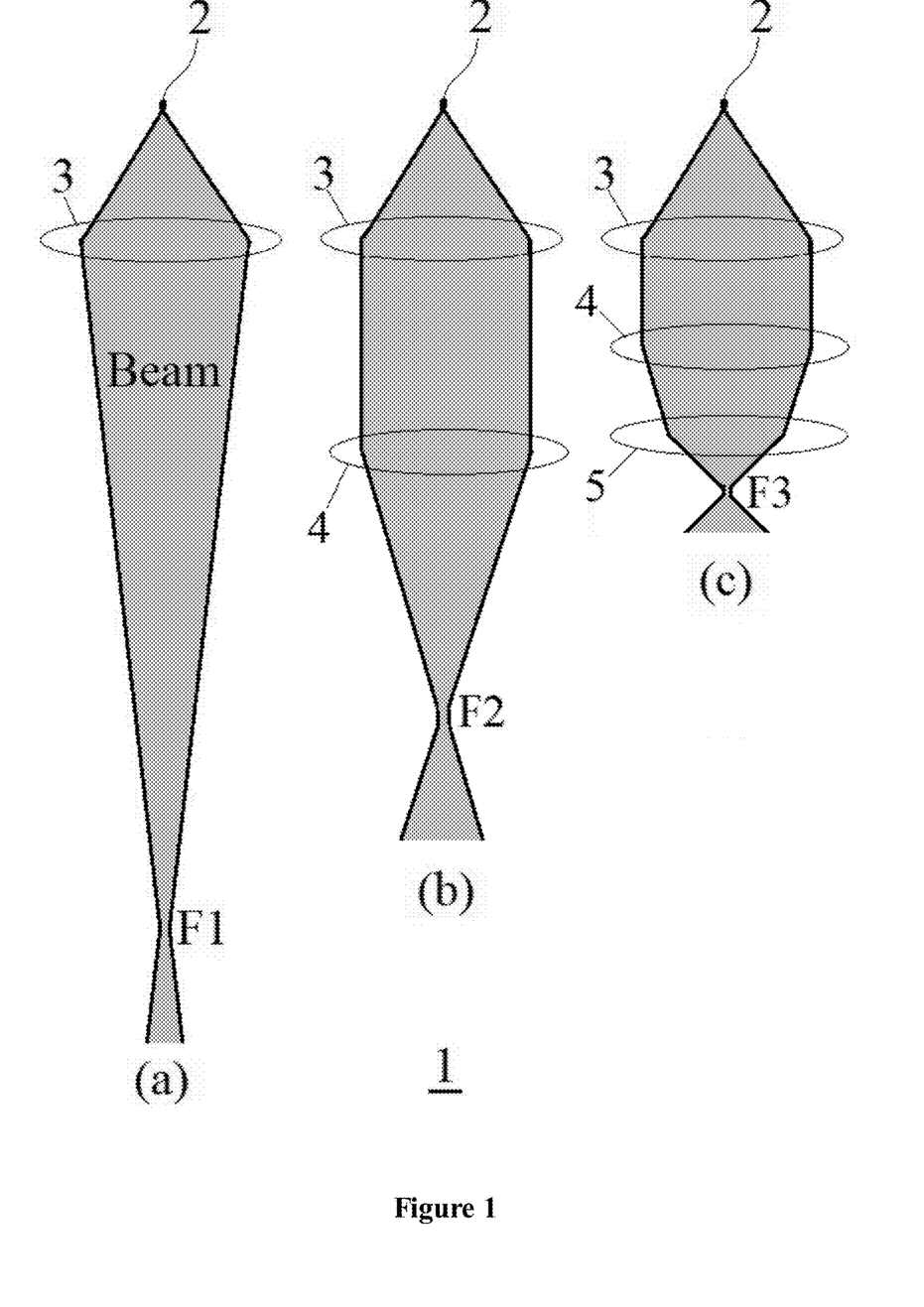
FIG. 1 schematically illustrates how co-condensers are formed in accordance with an exemplary embodiment of the present invention.

In an apparatus 1 of charged-particle beam as shown in FIG. 1, a source 2 of charged particles is configured to emit a beam of charged particles. The source 2 may be for example an electron gun with a tungsten filament or a lanthanum hexaboride ($LaB_6$). In panel (a), a magnetic condenser 3 alone can focus the beam to a crossover spot F1. The beam is expanded after a crossover spot. In panel (b), another magnetic condenser 4 is placed between magnetic condenser 3 and crossover spot F1, and the beam is now focused to a new crossover spot F2 that is closer to source 2 than spot F1. In panel (c), a third magnetic condenser 5 is placed between magnetic condenser 4 and crossover spot F2, and the beam is again focused to another new crossover spot F3 that is even closer to source 2 than spot F2.

In the present invention, the term "co-condensers" is defined as two or more magnetic condensers configured to coherently focus the beam to a single crossover spot F. For example, magnetic condensers 3 and 4 in panel (b) coherently focus the beam to a single crossover spot F2, and they may be called a set of co-condensers. Magnetic condensers 3, 4 and 5 in panel (c) coherently focus the beam to a single crossover spot F3, and they may also be called a set of co-condensers. As shown in FIG. 1, the beam does not have any crossover spot between any two of the two or more magnetic condensers within a set of co-condensers.

The crossover spot F may be movable or immovable. In some embodiments of the invention, the single crossover spot F is so controlled that it remains stationary or immovable relative to the source 2 of charged particles. For example, crossover spot F2 may be kept stationary relative to the source 2, i.e. the distance DO between spot F2 and source 2 remains unchanged. By the same token, crossover spot F3 may be kept stationary relative to the source 2, i.e. the distance DO between spot F3 and source 2 remains unchanged.

While the single crossover spot F remains immovable relative to the source 2 of charged particles, the size A of the beam at crossover spot F (i.e. the cross-sectional area of the beam at F) may be so controlled to have a desired value. Preferably, size A may be tuned/adjusted by concertedly tuning/adjusting the individual condensing capacity of the two or more magnetic condensers within a set of co-condensers. For example, the condensing capacity of condenser 3 and that of condenser 4 may be individually but concertedly tuned/adjusted so that not only the single crossover spot F2 is fixed relative to the source 2, but also the size A of the beam at crossover spot F2 is controlled to have a value as desired. Likewise, the condensing capacities of two or more condensers 3, 4 and 5 may be individually but concertedly tuned/adjusted so that not only the single crossover spot F3 is fixed relative to the source 2, but also the size A of the beam at crossover spot F3 is controlled to have a value as desired. The two or more co-condensers are therefore configured to coherently focus the beam to the same cross-over point with different magnification rates.

Although the apparatus 1 may include one, two or more sets of co-condensers, in some preferred embodiments of the invention, the apparatus 1 includes only one set of co-condensers with only two magnetic condensers configured to coherently focus the beam to a single crossover spot F. For example, the apparatus 1 may include only one set of co-condensers as shown in Panel (b) of FIG. 1 with only two magnetic condensers (3, 4) configured to coherently focus the beam to a single crossover spot F2.

Figure 2:
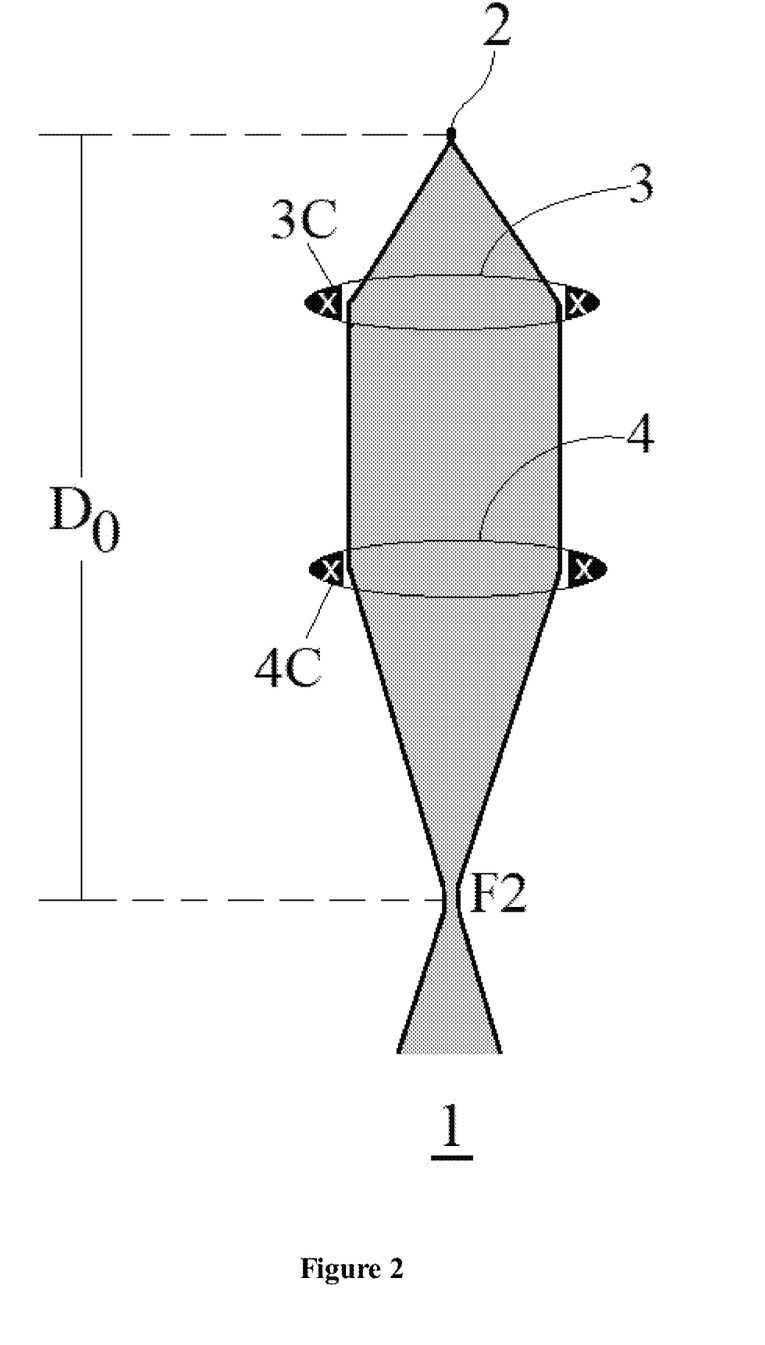
FIG. 2 shows two co-condensers with magnetic coils in accordance with an exemplary embodiment of the present invention.

Referring to FIG. 2, the only two magnetic condensers (3, 4) include a distal magnetic condenser 4 which is distal to the source 2, and a proximal magnetic condenser 3 that is located between the source 2 and the distal magnetic condenser 4. The proximal magnetic condenser 3 comprises a magnetic coil 3C driven by a coil current I1; and the distal magnetic condenser 4 comprises a magnetic coil 4C driven by a coil current I2. Generally, both coil currents I1 and I2 are greater than 0 (>0).

In preferred embodiments of the invention, coil currents I1 and I2 are configured to position single crossover spot F2 at a fixed position, i.e. maintain a predetermined distance D0 from source 2. With the "Fixed F2" condition being met, the size A of the crossover spot F2 may be increased by increasing coil current I1 and/or decreasing coil current I2; and decreased by decreasing coil current I1 and/or increasing coil current I2. The size A of the crossover spot F2 will be minimized when coil current I1 reaches its minimal value while coil current I2 reaches its maximal value. The size A is maximized when coil current I2 reaches its minimal value while I1 reaches its maximal value. There is no special limitation on the maximized size A, it may be smaller than, equal to, or bigger than the size of the source 2.

Figure 3:
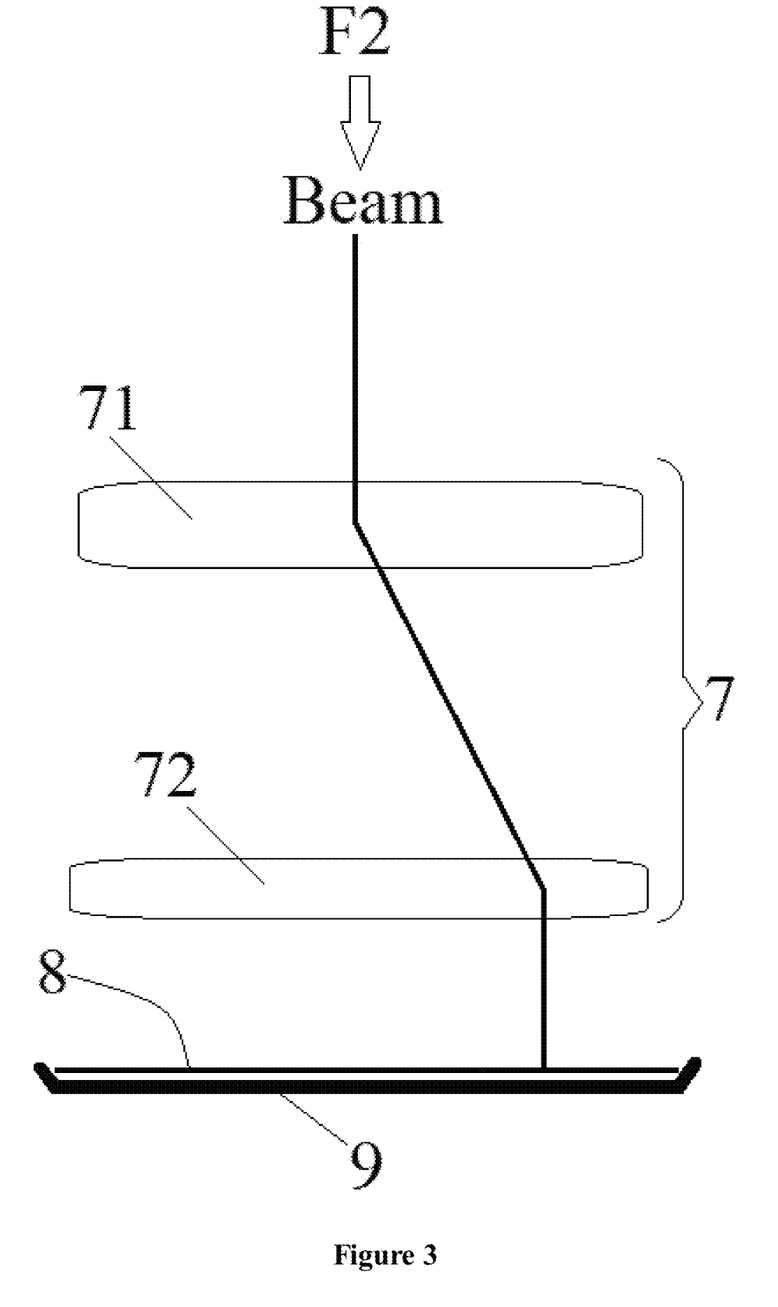
FIG. 3 illustrates an apparatus of charged-particle beam with a magnetic objective lens and a deflection system in accordance with an exemplary embodiment of the present invention.
Figure 8:
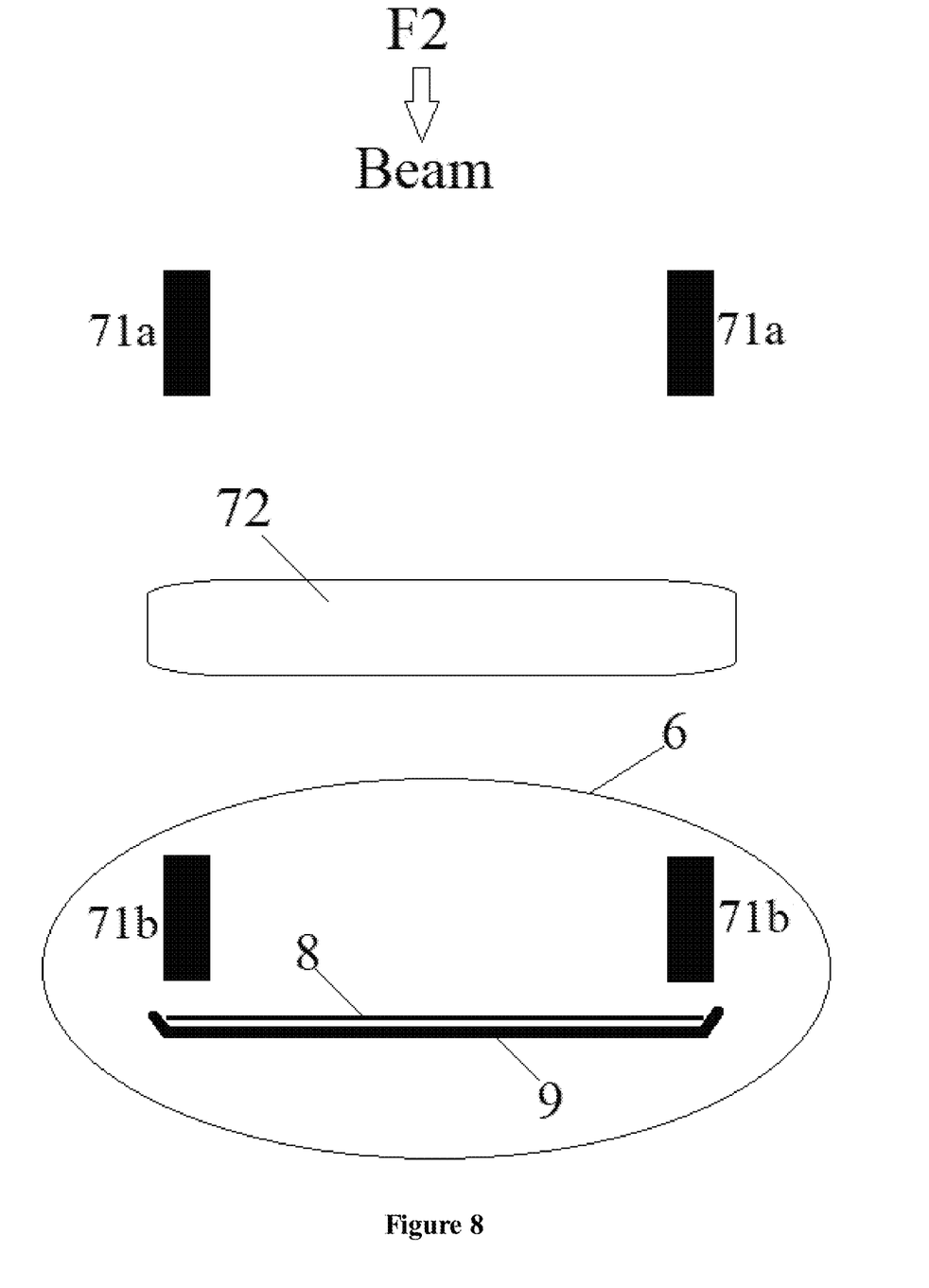
FIG. 8 schematically illustrates the configuration of a macroscopic deflection sub-system in accordance with an exemplary embodiment of the present invention.
Figure 9:
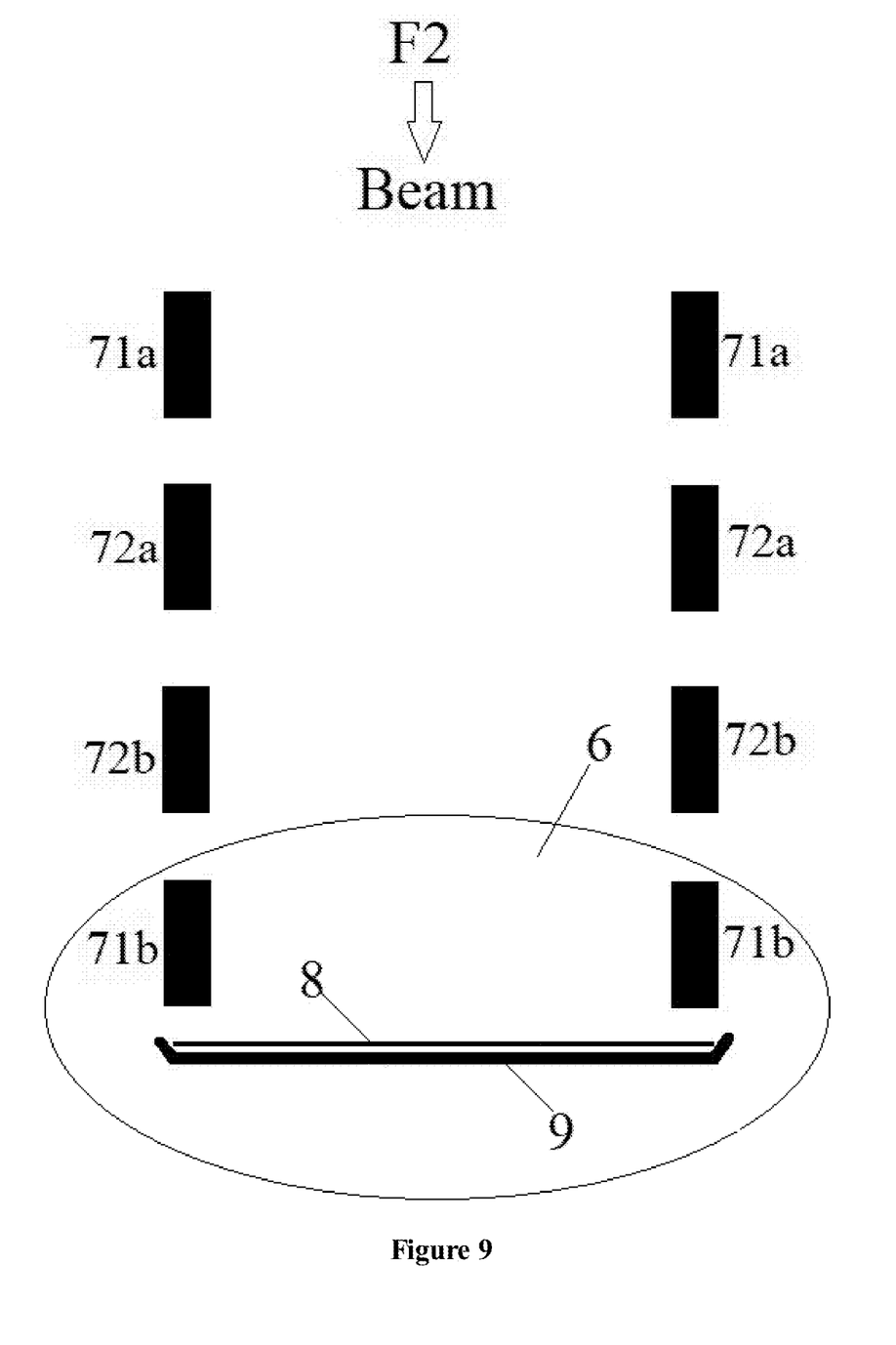
FIG. 9 schematically illustrates the configuration of a microscopic deflection sub-system in accordance with an exemplary embodiment of the present invention.
Figure 10:
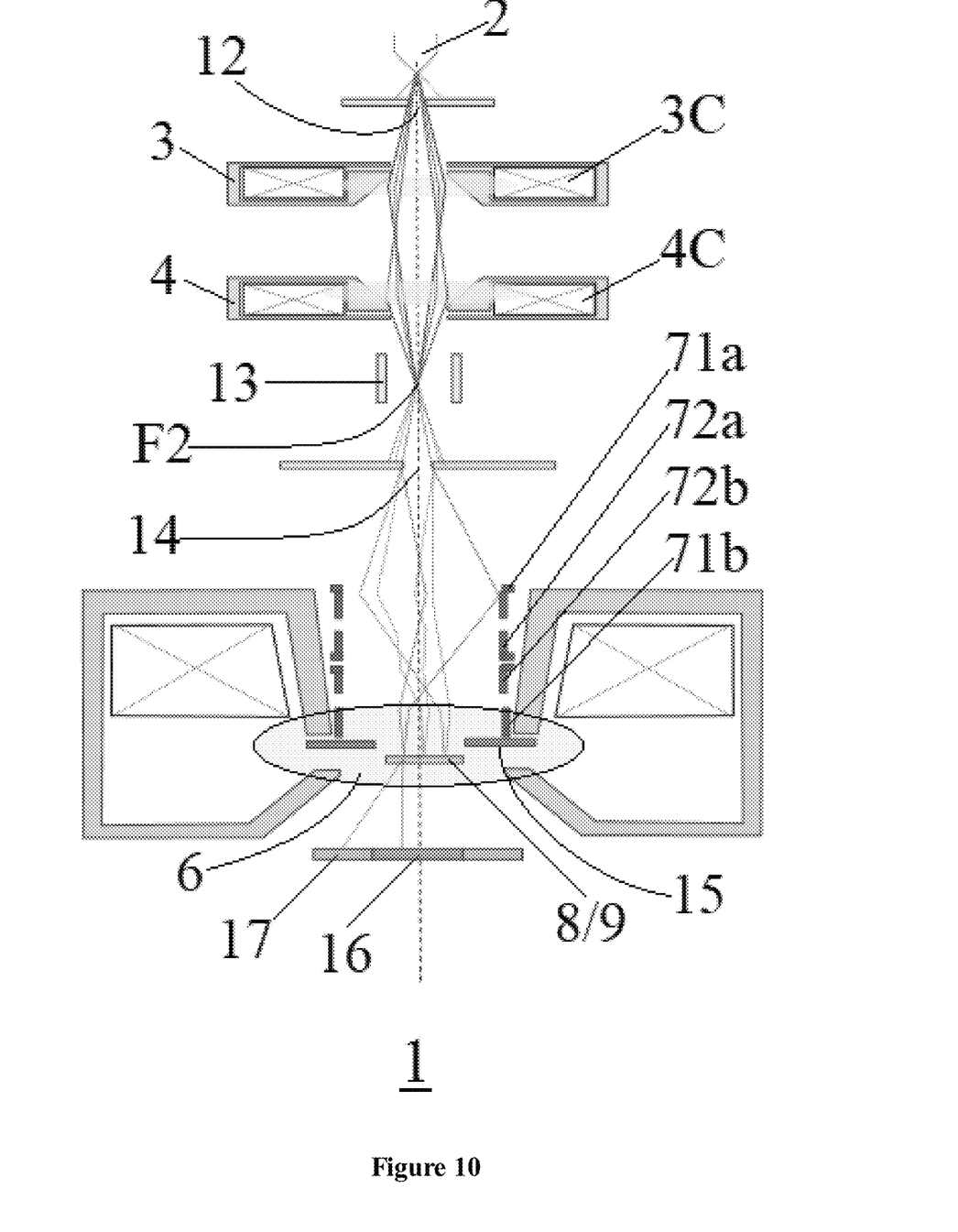
FIG. 10 shows an apparatus of charged-particle beam with two co-condensers in accordance with an exemplary embodiment of the present invention.

In various exemplary embodiments as shown in FIG. 3, the apparatus of charged-particle beam according to the invention may include a magnetic objective lens 6 (as shown in FIGS. 8-10) and a deflection system 7, which are downstream with respect to the single crossover spot F. (e.g. F2). Although electron lenses may operate electrostatically or magnetically, most electron lenses use electromagnetic coils to generate a convex lens. The field produced for the lens is typically radially symmetrical, as deviation from the radial symmetry of the magnetic lens causes aberrations such as astigmatism and worsens spherical and chromatic aberration. For example, a quadrupole lens is an arrangement of electromagnetic coils at the vertices of the square, enabling the generation of a lensing magnetic fields, the hexapole configuration simply enhances the lens symmetry by using six, rather than four coils. Electron lenses may be manufactured from iron, iron-cobalt or nickel cobalt alloys, such as permalloy, due to their good magnetic properties, such as magnetic saturation, hysteresis and permeability. It should be appreciated that the objective lens 6 may be an electromagnetic lens or an electrostatic lens.

Objective lens 6 allows for electron beam convergence, with the angle of convergence as a variable parameter. The magnification may be simply changed by modifying the amount of current that flows through the coil of lenses. Lens 6 may include yoke, magnetic coil, poles, pole piece, and external control circuitry. An electromagnetic lens may include an upper pole piece and a lower pole piece. The pole piece must be manufactured in a very symmetrical manner, as this provides the boundary conditions for the magnetic field that forms the lens. Imperfections in the manufacture of the pole piece can induce severe distortions in the magnetic field symmetry, which induce distortions that will ultimately limit the lenses' ability to reproduce the object plane. The exact dimensions of the gap, pole piece internal diameter and taper, as well as the overall design of the lens is often performed by finite element analysis of the magnetic field, taking into account of the thermal and electrical constraints of the design. The coils which produce the magnetic field are located within the lens yoke. The coils can contain a variable current, but typically utilize high voltages, and therefore require significant insulation in order to prevent short-circuiting the lens components. Thermal distributors are placed to ensure the extraction of the heat generated by the energy lost to resistance of the coil windings. The windings may be water-cooled, using a chilled water supply in order to facilitate the removal of the high thermal duty.

For the deflection system 7, it may include a macroscopic deflection sub-system 71 and a microscopic deflection subsystem 72. The deflection system 7 causes the beam to scan across a large field of view (FOV) on a specimen plane 8 of a specimen holder 9 and one or more small FOVs within the large FOV.

Figure 4:
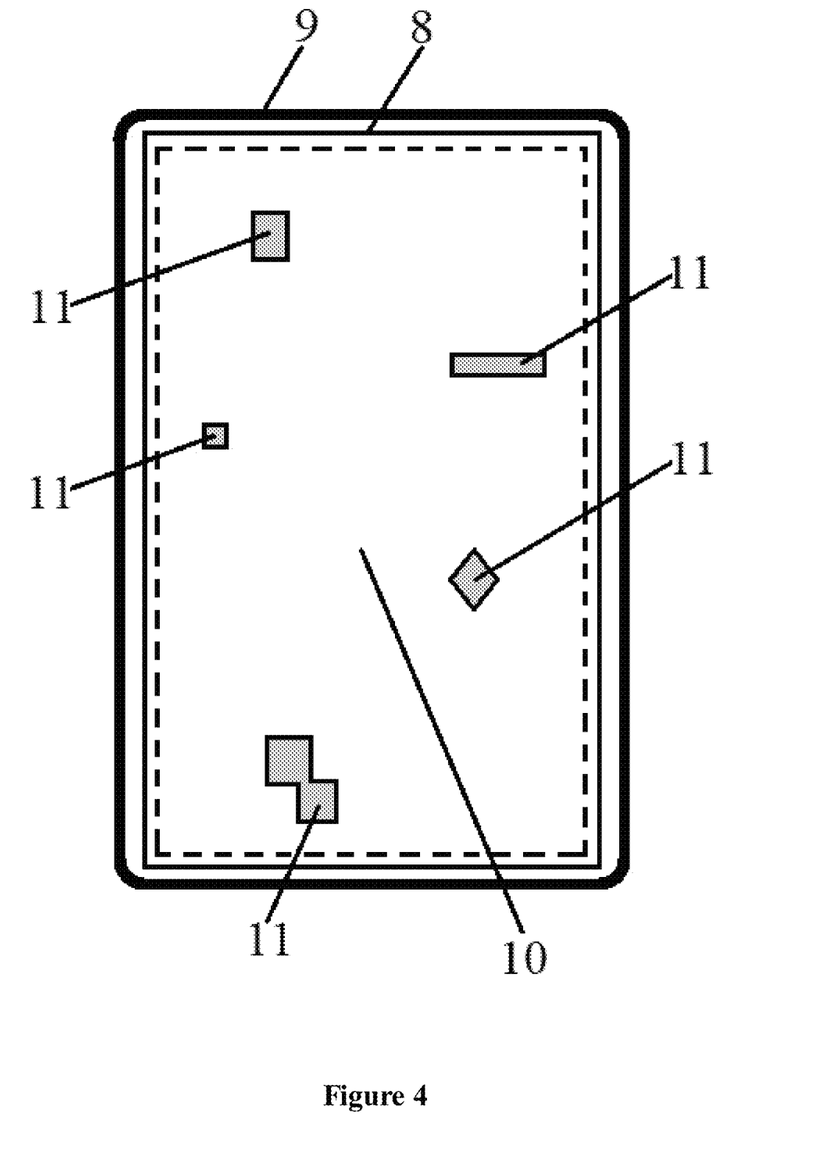
FIG. 4 demonstrates a single large FOV on the specimen plane of the apparatus in accordance with an exemplary embodiment of the present invention.
Figure 5:
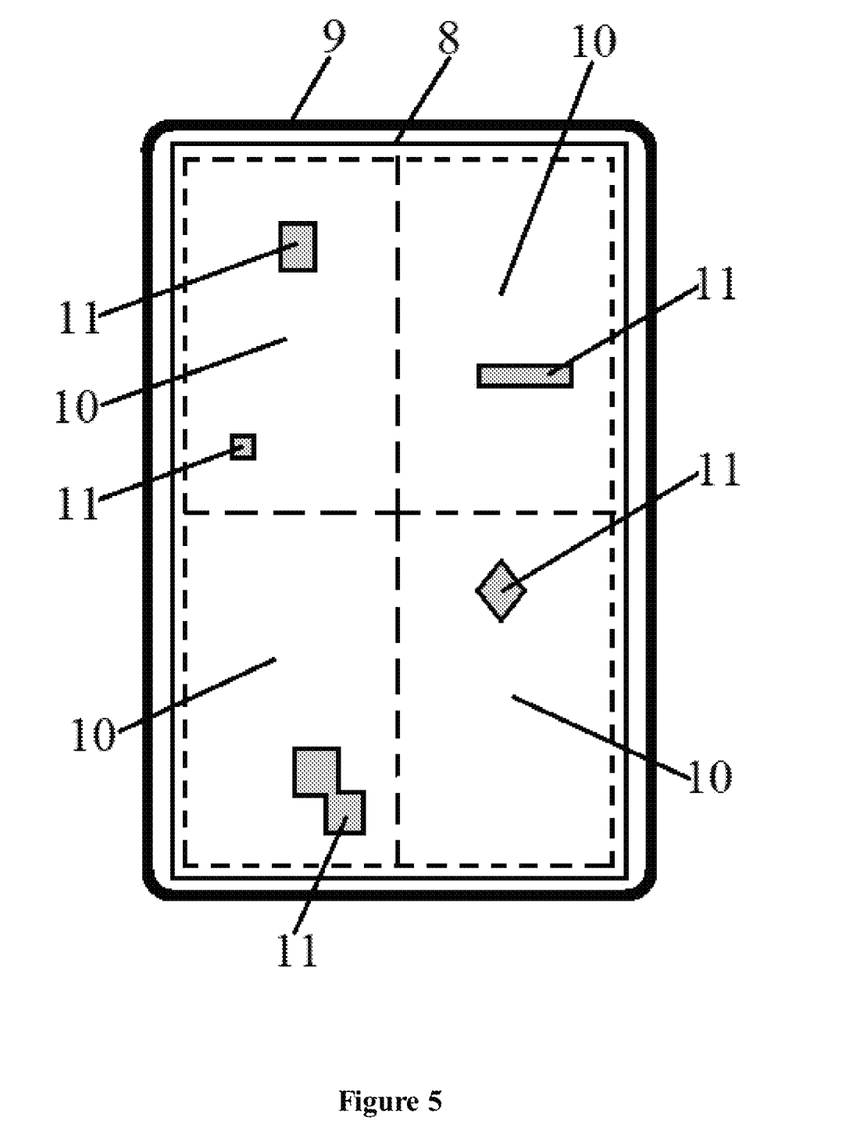
FIG. 5 demonstrates multiple large FOVs on the specimen plane of the apparatus in accordance with an exemplary embodiment of the present invention.

As shown in FIGS. 4 and 5, the macroscopic deflection sub-system 71 causes the beam to scan across a large field of view (FOV) 10 on the specimen plane 8 of the specimen holder 9, and the microscopic sub-deflection system 72 causes the beam to scan across one or more small FOVs 11 within a large FOV. As shown in FIG. 4, the specimen plane 8 may contain only one large FOV 10, which may contain zero, one, two, three or more small FOVs 11. In FIG. 5, the specimen plane 8 may contain two, three or more large FOVs 10, each of which may contain zero, one, two, three or more small FOVs 11.

Figure 6:
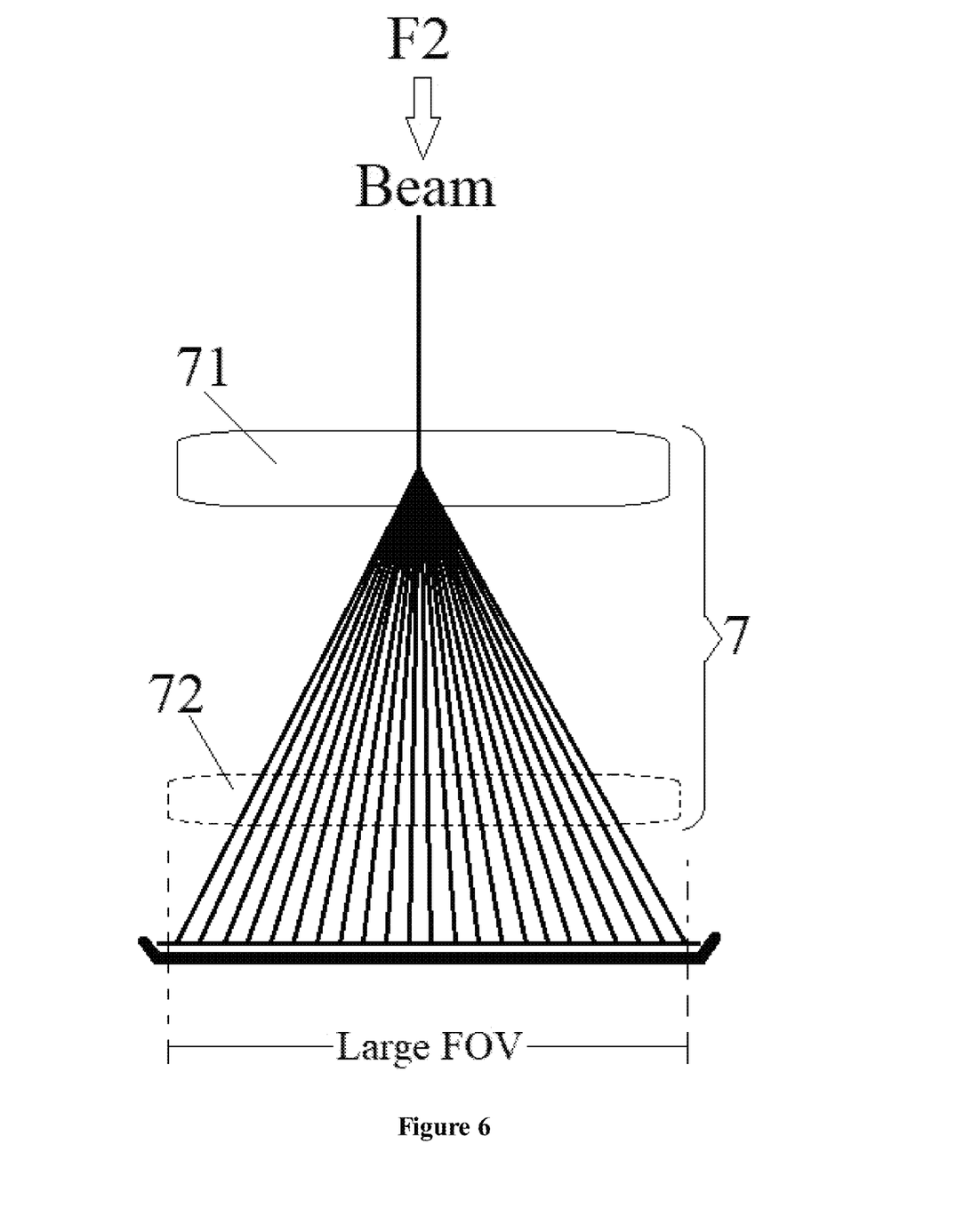
FIG. 6 illustrates a macroscopic deflection sub-system alone causing the beam to scan across a large FOV in accordance with an exemplary embodiment of the present invention.

In the first step of an examination process as shown in FIG. 6, a user may turn off or inactivate the microscopic sub-deflection system 72. Then, the macroscopic deflection sub-system 71 causes the beam to scan across a large FOV 10 on the specimen plane 8 of the specimen holder 9 under a lower resolution (e.g. 10 nm). After the large FOV scanning is completed, the user finds a pattern of interesting (POI) in one or more small FOVs 11 within that large FOV 10, and the user will then zoom into the POI for further examination with a higher resolution (e.g. 1 nm). As an advantage of the present invention, the user will not need to mechanically move the specimen holder 9 to reposition or align the specimen plane 8 to the center of a target small FOV 11. In other words, the specimen holder 9 remains stationary relative to the source 2 of charged particles, no matter the beam is scanning across a given large FOV 10 or subsequently scanning across one, two or more small FOVs 11 within that large FOV 10.

Figure 7:
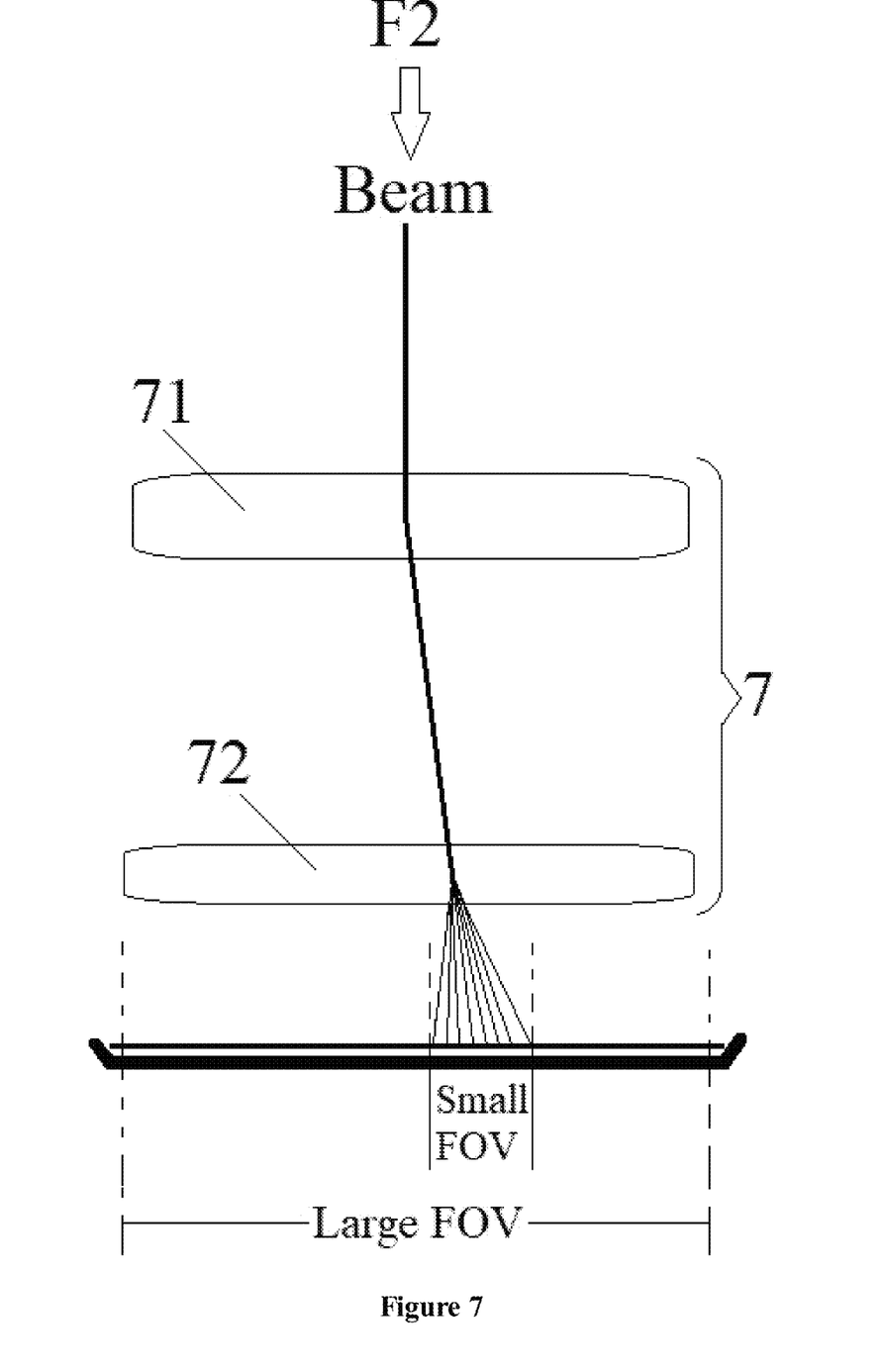
FIG. 7 illustrates a microscopic deflection sub-system causing the beam to scan across a small FOV in accordance with an exemplary embodiment of the present invention.

Instead, the user may run the second step by simply retrieving stored deflecting parameter(s) of the macroscopic deflection sub-system 71 which previously directed the beam to the center of the target small FOV 11. The retrieved deflecting parameter(s) of the macroscopic deflection subsystem 71 will then be re-applied to the subsystem 71, to direct the beam to the center of the target small FOV 11. Generally, the position of any small FOV within a large FOV may be controlled as desired by the macroscopic deflection sub-system 71 by retrieving and re-applying stored deflecting parameters (e.g. voltage). As shown in FIG. 7, after the position of the small FOV within the large FOV is fixed by the macroscopic deflection sub-system 71, the retrieved and re-applied deflecting parameter(s) of the macroscopic deflection sub-system 71 will remain unchanged. Then, the deflecting parameter(s) of the microscopic deflection subsystem 72 is/are varied to cause the beam to scan across the small FOV with a higher resolution.

In various embodiments of the invention, when the beam scans across the large FOV 10 in the first step, the spot F2 has a size A1. When the beam scans across the small FOV 11 within the large FOV 10 in the second step, the spot F2 has a size A2, and A2<A1. The inequation of A2<A1 will result in the resolution for scanning a small FOV is higher than that for a large FOV.

Typically, the size of the large FOV 10 is adjustable, and its image may range from 50 um×50 um to 200 um×200 um in size with a resolution of 0.5-20 nm. For example, the large FOV 10 may have a size of 100 um×100 um with a resolution of 8 nm. The small FOV 11 (e.g. POI, or area of interest) is also adjustable, and it may range from 0.5 um×0.5 um to 5 um×5 um in size with a resolution of 0.5-2 nm. For example, the small FOV may have a size of 5 um×5 um with a resolution of 0.5 nm.

As shown in FIG. 8, the macroscopic deflection subsystem 71 may include an upper deflector 71a and a lower deflector 71b. The microscopic deflection sub-system 72 may be located between the upper deflector 71a and the lower deflector 71b of the macroscopic deflection system 71. The specimen holder 9 may be downstream with respect to the lower deflector 71b of the macroscopic deflection subsystem 71. As shown in FIG. 9, the microscopic deflection sub-system 72 may also include an upper deflector 72a and a lower deflector 72b.

Any other components known in any apparatus of charged-particle beam or their proper combination may be incorporated in the present invention. For a skilled person in the art, many of the components not shown in FIG. 1 are well-known, for example, suppressor electrode, beam extractor, anode, gun aperture, condenser lens that is responsible for primary beam formation, beam blanker, stigmator for the correction of asymmetrical beam distortions, objective aperture, SEM up detector, deflector, bright field (BF) detector, dark field (DF) detector. A system for the insertion into, motion within, and removal of specimens from the beam path is also needed. The system may include load lock, chamber interlock, lock port, loading and unloading mechanism, and transfer table. Other parts in the microscope may be omitted or merely suggested. In a specific yet exemplary electron microscope 1 as shown in FIG. 10, the source of charged particles may be an electron gun 2 configured to emit an electron beam through gun aperture 12. Along the beam trajectory, co-condenser 3 with magnetic coil 3C is placed between gun aperture 12 and co-condenser 4 with a magnetic coil 4C. The electron beam is focused to crossover spot F2 before it passes through beam blanking 13. After the beam passes through objective aperture 14, it is deflected by an upper deflector 71a and a lower deflector 71b in the macroscopic deflection sub-system 71. It can also be deflected by an upper deflector 72a and a lower deflector 72b in the microscopic deflection sub-system 72. In the meanwhile, the beam is focused by the magnetic objective lens 6 onto a specimen within the specimen holder 9. Electrons scattered from and penetrated through the specimen are detected by the BSE detector 15, BF detector 16 and DF detector 17 for generating specimen images.

The multiple deflection system (71a, 71b, 72a and 72b) is designed to control electron deflection with different FOV size. For example, deflectors or deflection nodes 71a and 71b control electron beam to be incident on a large FOV, while deflectors 72a and 72b on a small FOV size.

Figure 11:
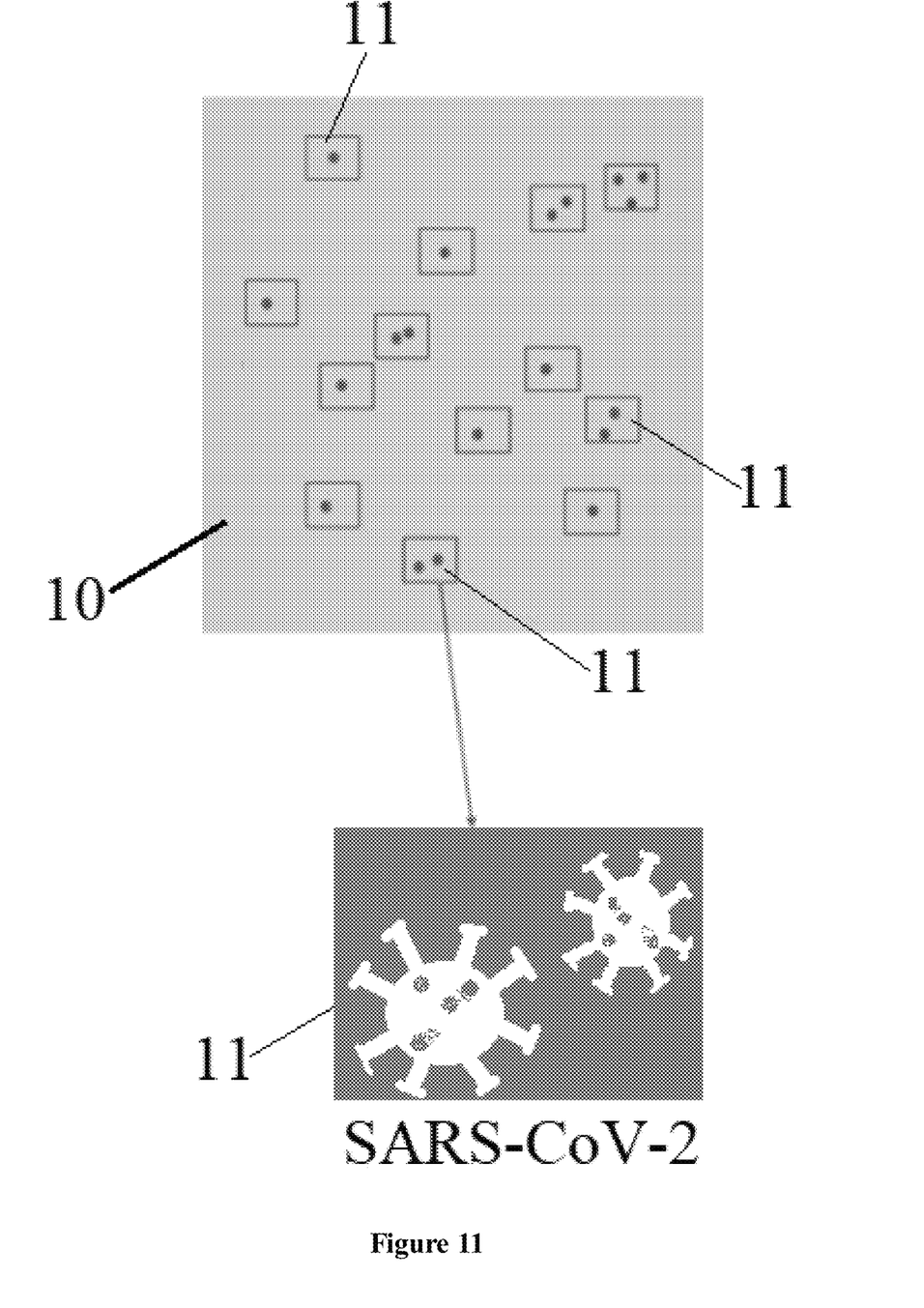
FIG. 11 shows the image of a biological sample in a large FOV with low resolution and a small FOV with high resolution in accordance with an exemplary embodiment of the present invention.

The novel EM column system as shown in FIG. 10 can scan larger FOV with low resolution (like 5, 10 or 20 nm) for the full FOV size. Then, the EM column can switch to high resolution (like 1 nm) automatically without any position and focus change and start immediately to scan high resolution image on any special location. A specific software algorithm can be used to control EM scanning of a larger FOV image with two deflectors (71a, 71b) and co-condensers (3, 4) in a lower resolution mode (i.e. higher contribution from co-condenser 3 or lower contribution from co-condenser 4). The algorithm will detect related POI (pattern of interesting) and record related location(s). As shown in FIG. 11, the algorithm can detect related POI (pattern of interesting) such as the morphological features of Covid-19 virus (SARS-CoV-2) in a biological sample and record their location(s). Then the software will switch co-condensers (3, 4) to a higher resolution mode (i.e. a lower contribution from co-condenser 3 or a higher contribution from co-condenser 4). The two deflection nodes (71a and 71b) are set to or fixed to a controlled voltage. Other two deflection nodes (72a and 72b) are then used to scan a small FOV 11 with the higher resolution. As shown in the lower panel of FIG. 11, an image of Covid-19 virus (SARS-CoV-2) with a high resolution is acquired. A software system can combine BSE, DF, BF's images from TEM/STEM system and use a machine learning (ML) algorithm to generate an enhanced image with differenced image resolution. Such operations, tasks, and functions are sometimes referred to as being computer-executed, computerized, processor-executed, software-implemented, or computer-implemented. They may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

When implemented in software or firmware, various elements of the systems described herein are essentially the code segments or executable instructions that, when executed by one or more processor devices, cause the host computing system to perform the various tasks. In certain embodiments, the program or code segments are stored in a tangible processor-readable medium, which may include any medium that can store or transfer information. Examples of suitable forms of non-transitory and processor-readable media include an electronic circuit, a semiconductor memory device, a ROM, a flash memory, an erasable ROM (EROM), a floppy diskette, a CD-ROM, an optical disk, a hard disk, or the like.

Through the above description of the embodiments, those skilled in the art can understand clearly that the present application may be implemented by means of software plus necessary hardware platforms, or of course, may also be implemented all by software or hardware. Based on such understanding, the entirety of or a portion of that the technical solutions of the present application contribute over the background art may be embodied in the form of a software product. The computer software product may be stored in storage medium, such as ROM/RAM, disk, optical disk, etc., and comprise several instructions for enabling one computer apparatus (which may be a personal computer, a server, or a network equipment, etc.) to execute the methods described in the respective embodiments or described in certain parts of the embodiments of the present application.

In the foregoing specification, embodiments of the present invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicant to be the scope of the invention, is the literal and equivalent scope of the set of claims that issue from this application, in the specific form in which such claims issue, including any subsequent correction.

The invention claimed is:

1. An apparatus of charged-particle beam comprising:
   a source of charged particles configured to emit a beam of charged particles, and co-condensers,
   wherein the term "co-condensers" is defined as two or more magnetic condensers configured to coherently focus the beam to a single crossover spot F,
   wherein said two or more magnetic condensers includes only two magnetic condensers configured to coherently focus the beam to a single crossover spot F, wherein said only two magnetic condensers include a distal magnetic condenser which is distal to the source, and a proximal magnetic condenser that is located between the source and the distal magnetic condenser, wherein the proximal magnetic condenser comprises a magnetic coil driven by a coil current I1, wherein the distal magnetic condenser comprises a magnetic coil driven by a coil current I2, wherein a size A of the crossover spot F is increased by increasing coil current I1 and/or decreasing coil current I2, wherein the size A of the crossover spot F is decreased by decreasing coil current I1 and/or increasing coil current I2, and wherein the size A of the crossover snot F is minimized when coil current I1 reaches its minimal value and coil current I2 reaches it maximal value, and the size A is maximized when coil current I2 reaches its minimal value and I1 reaches its maximal value.

2. The apparatus according to claim 1, wherein the beam does not have a crossover spot between any two of said two or more magnetic condensers, or wherein said single crossover spot F remains stationary relative to the source of charged particles.

3. The apparatus according to claim 1, wherein I1>0, and I2>0.

4. The apparatus according to claim 1, wherein the maximized size A is bigger than the size of the source.

5. The apparatus according to claim 1, further comprising a magnetic objective lens and a deflection system, both of which are downstream with respect to the single crossover spot F.

6. The apparatus according to claim 5, wherein the deflection system includes a macroscopic deflection sub-system and a microscopic deflection sub-system.

7. The apparatus according to claim 6, wherein the macroscopic deflection sub-system causes the beam to scan across a large field of view (FOV) on a specimen plane, and wherein the microscopic sub-deflection system causes the beam to scan across a small FOV within said large FOV.

8. The apparatus according to claim 7, wherein the position of the small FOV within the large FOV is controlled by the macroscopic deflection sub-system.

9. The apparatus according to claim 8, wherein, after the position of the small FOV within the large FOV is fixed by the macroscopic deflection sub-system, deflecting parameter (s) of the macroscopic deflection sub-system remain unchanged while deflecting parameter(s) of the microscopic deflection sub-system is/are varied to cause the beam to scan across the small FOV.

10. The apparatus according to claim 9, wherein, when the beam scans across the large FOV, the spot F has a size A1, and wherein, when the beam scans across the small FOV, the spot F has a size A2, and A2<A1.

11. The apparatus according to claim 6, wherein the macroscopic deflection sub-system comprises an upper deflector and a lower deflector.

12. The apparatus according to claim 11, wherein the microscopic deflection sub-system is located between the upper deflector and the lower deflector of the macroscopic deflection system.

13. The apparatus according to claim 11, wherein the microscopic deflection sub-system includes an upper deflector and a lower deflector.

14. The apparatus according to claim 12, further comprising a specimen holder which is downstream with respect to the lower deflector of the macroscopic deflection sub-system, wherein the specimen holder remains stationary relative to the source of charged particles, no matter the beam is scanning across a given large FOV or scanning across the small FOVs within said given large FOV.

* * * * *